(12) United States Patent
Ichikawa et al.

(10) Patent No.: US 6,467,666 B2
(45) Date of Patent: Oct. 22, 2002

(54) METHOD OF PRODUCING A SEMICONDUCTOR DEVICE

(75) Inventors: Seiji Ichikawa; Tatsuo Tokue; Nobuo Nagano; Fumie Ogihara; Taku Sato, all of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/870,299

(22) Filed: May 30, 2001

(65) Prior Publication Data

US 2001/0048014 A1 Dec. 6, 2001

(30) Foreign Application Priority Data

May 31, 2000 (JP) ........................................ 2000-161388

(51) Int. Cl.⁷ .............................................. B65H 23/00
(52) U.S. Cl. ........................................................ 225/2
(58) Field of Search ................................................ 225/2

(56) References Cited

U.S. PATENT DOCUMENTS

| 5,609,284 A | * | 3/1997 | Kondratenko | ............... | 225/2 X |
| 5,678,744 A | * | 10/1997 | Nakamura | .................... | 225/2 |
| 5,740,953 A | * | 4/1998 | Smith et al. | .................... | 225/2 |
| 5,786,266 A | * | 7/1998 | Boruta | ....................... | 225/2 X |

FOREIGN PATENT DOCUMENTS

| JP | 61-253830 | 11/1986 | ............ H01L/21/78 |
| JP | 6-11071 | 2/1994 | ............ H01L/21/78 |
| JP | 2748355 | 2/1998 | .......... H01L/21/301 |
| JP | 2780618 | 5/1998 | ............ H01L/33/00 |
| JP | 11-224865 | 8/1999 | .......... H01L/21/301 |

* cited by examiner

Primary Examiner—Douglas D. Watts
(74) Attorney, Agent, or Firm—Hayes Soloway PC

(57) ABSTRACT

A method of producing a semiconductor device of the present invention is applicable to a multilayer wafer for leadless chip carrier packages and breaks it on a package basis. The method begins with a step of forming a generally V-shaped groove in one major surfaces of the wafer in the direction of thickness of the wafer. A weak, cleaving portion is formed in the other major surface of the wafer in alignment with the groove. A cleaving force is exerted on the wafer to thereby form a break in the cleaving portion, so that the wafer is caused to break from the groove toward the cleaving portion in the direction of thickness of the wafer. The cleaving portion may be replaced with a strong, non-cleaving portion, in which case the break is formed in the interface between the non-cleaving portion and the wafer due to a difference in cleaving force.

6 Claims, 4 Drawing Sheets

METHOD OF PRODUCING A SEMICONDUCTOR DEVICE

BACKGROUND OF THE INVENTION

The present invention relates to a method of producing a semiconductor package by breaking a multilayer wafer for leadless chip carrier packages on a package basis.

A multilayer wafer for the above application has customarily been formed with aligned V-shaped grooves in opposite major surfaces thereof. A cleaving force is exerted on the wafer in order to break it on a package basis. Specifically, when the cleaving force acts on the wafer, which has a crystal structure, the direction in which the wafer breaks is not constant. The grooves formed in the wafer serve to maintain the above direction constant.

However, the grooves are formed in the wafer by half-cutting instead of full-cutting. This brings about a problem that if the grooves are not accurately aligned, then breaking equipment is likely to fail to break the wafer along a line connecting the grooves. Specifically, it is likely that the wafer breaks from one groove, but misses the other groove. As a result, a burr appears on the resulting chip and prevents the chip from being accurately mounted.

Technologies relating to the present invention are disclosed in, e.g., Japanese Patent Laid-Open Publication Nos. 61-253830 and 11-224865, Japanese Patent Publication No. 6-11071, and Japanese Patents 2,748,355 and 2,780,618.

SUMMARY OF THE INVENTION

It is an object of the present invention to provide a method of producing a semiconductor device capable of braking a multilayer wafer for leadless chip carrier packages on a package basis with a minimum of burrs.

A method of producing a semiconductor device of the present invention is applicable to a multilayer wafer for leadless chip carrier packages and breaks it on a package basis. The method begins with a step of forming a generally V-shaped groove in one major surfaces of the wafer in the direction of thickness of the wafer. A weak, cleaving portion is formed in the other major surface of the wafer in alignment with the groove. A cleaving force is exerted on the wafer to thereby form a break in the cleaving portion, so that the wafer is caused to break from the groove toward the cleaving portion in the direction of thickness of the wafer. The cleaving portion may be replaced with a strong, non-cleaving portion, in which case the break is formed in the interface between the non-cleaving portion and the wafer due to a difference in cleaving force.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1A:
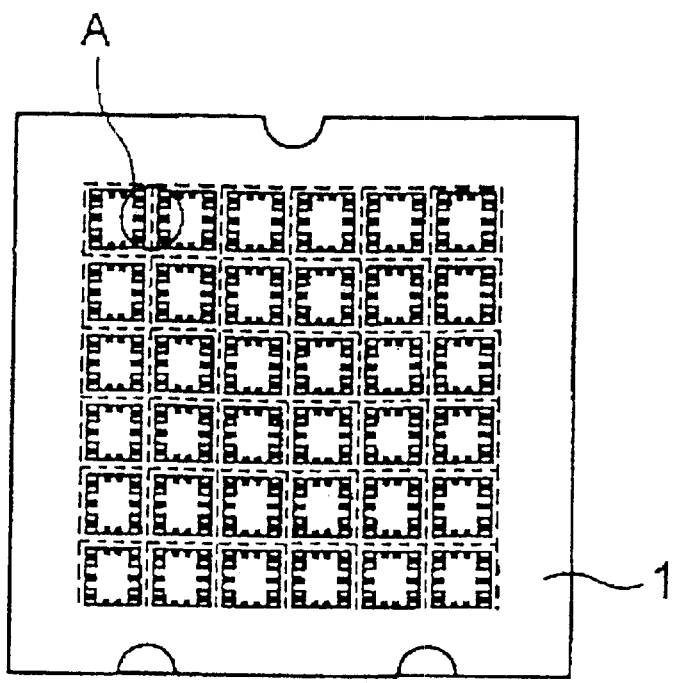
FIG. 1A is a plan view showing a multilayer wafer to be broken by a conventional method of producing a semiconductor device.

To better understand the present invention, brief reference will be made to a conventional method of producing a semiconductor device, shown in FIGS. 1A and 1B. The method to be described is assumed to break a multilayer wafer for leadless chip carrier packages on a package basis. As shown, a multilayer wafer 1 has a front surface 1a and a rear surface 1b. A dicing blade, not shown, forms generally V-shaped grooves 2a and 2b in the front surface 1a and rear surface 1b, respectively. The wafer 1 formed with the grooves 2a and 2b is passed through breaking equipment, not shown, including a pair of rollers. The rollers exert a cleaving force on the grooves 2a and 2b of the wafer 1 to thereby break the wafer 1 on a package basis.

Figure 1B:
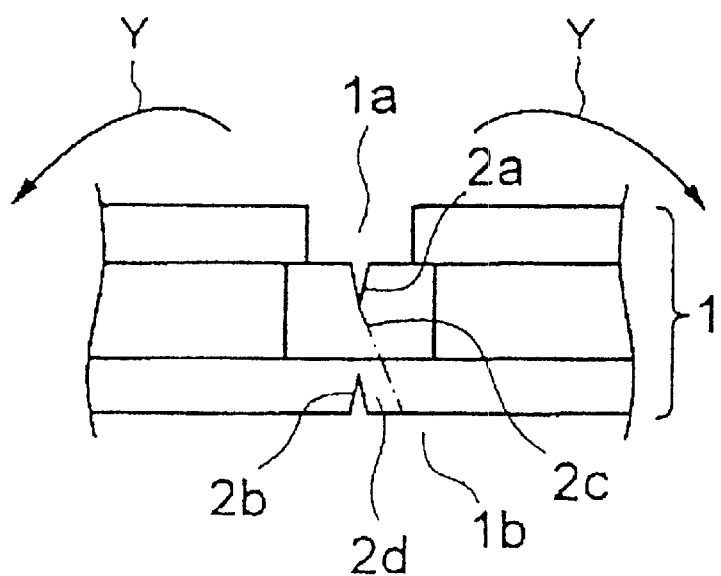
FIG. 1B is a section showing part of the wafer of FIG. 1A indicated by a circle A.

When the breaking equipment breaks the wafer 1, a force that tends to force the groove 2a of the front surface 1a open in the right-and-left direction, as indicated by an arrow Y in FIG. 1B, acts on the groove 2a. At this instant, the grooves 2a and 2b allow the wafer 1 to break in a preselected direction.

The grooves 2a and 2b are formed in the wafer 1 by half-cutting instead of full-cutting. This brings about a problem that if the grooves 2a and 2b are not accurately aligned, then breaking equipment is likely to fail to break the wafer 1 along a line connecting the grooves 1a and 1b. Specifically, it is likely that the wafer 1 is cut along a dash-and-dot line 2c shown in FIG. 1B that extends from the groove 1a, but misses the groove 2b. As a result, a burr 2d appears on the resulting chip and prevents the chip from being accurately mounted.

Figure 2A:
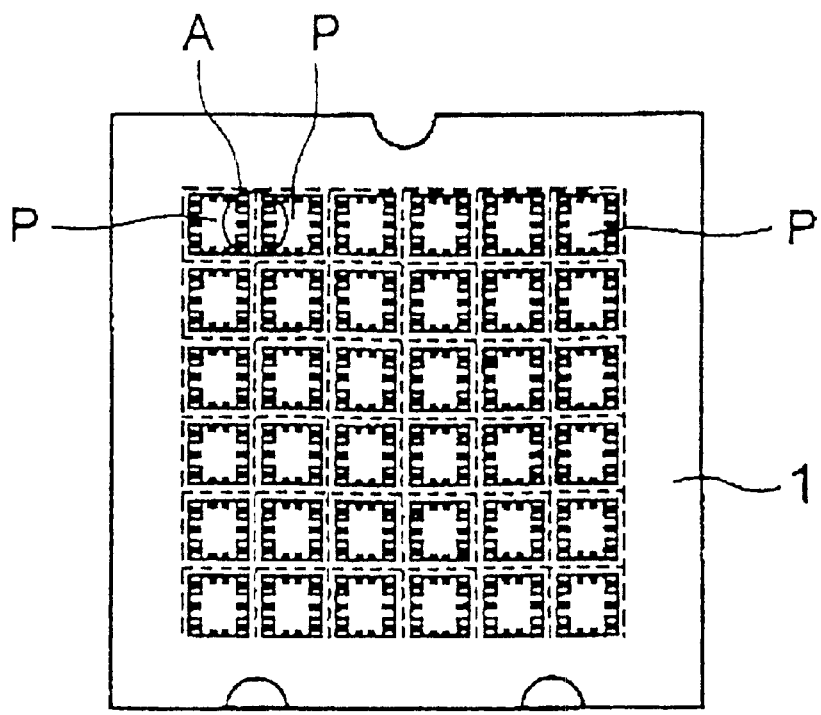
FIG. 2A is a plan view showing a multilayer wafer to be broken by a first embodiment of the method of producing a semiconductor device in accordance with the present invention.
Figure 2B:
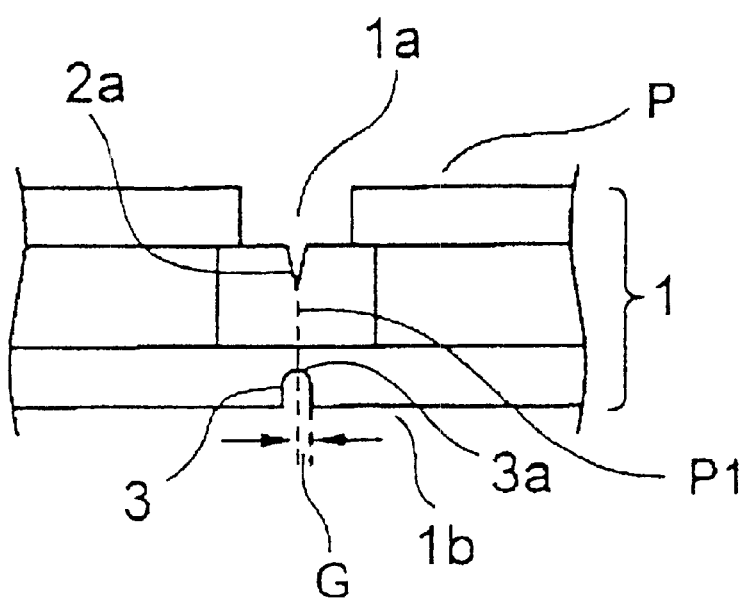
FIG. 2B is a section showing part of the wafer of FIG. 1A indicated by a circle A.
Figure 3:
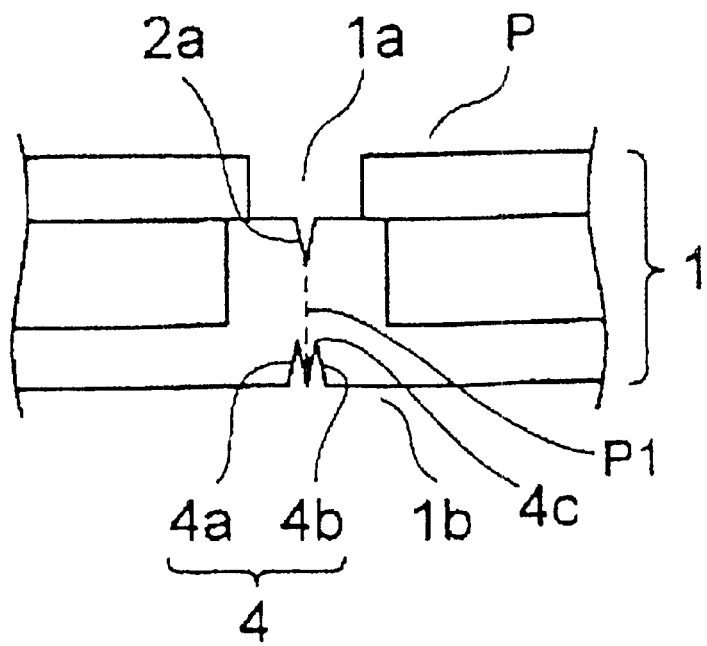
FIG. 3 is a section corresponding to FIG. 2B, showing a second embodiment of the present invention.
Figure 4:
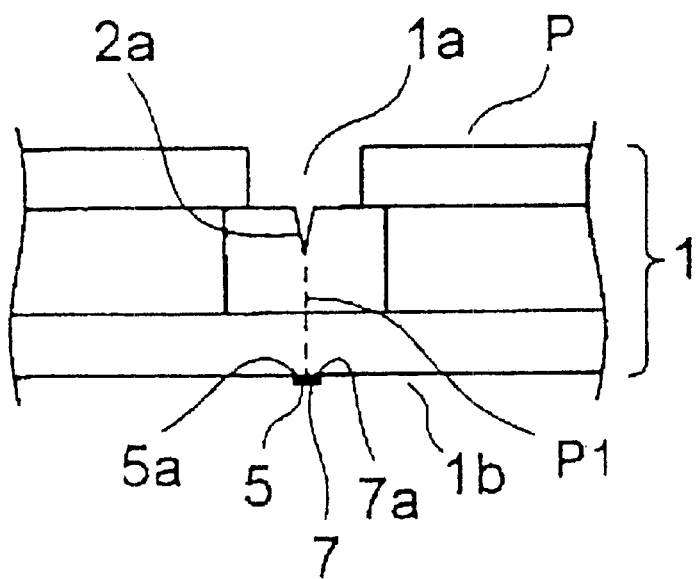
FIG. 4 is a section also corresponding to FIG. 2B, showing a third embodiment of the present invention.

A first to a third preferred embodiment of the present invention free from the above-discussed problem will be described with reference to FIGS. 2A, 2B, 3, 4 and 5. FIG. 2A shows a multilayer wafer 1 to which the illustrative embodiments are applied. FIGS. 2B, 3 and 4 are sections showing the first, second and third embodiments, respectively.

Figure 5:
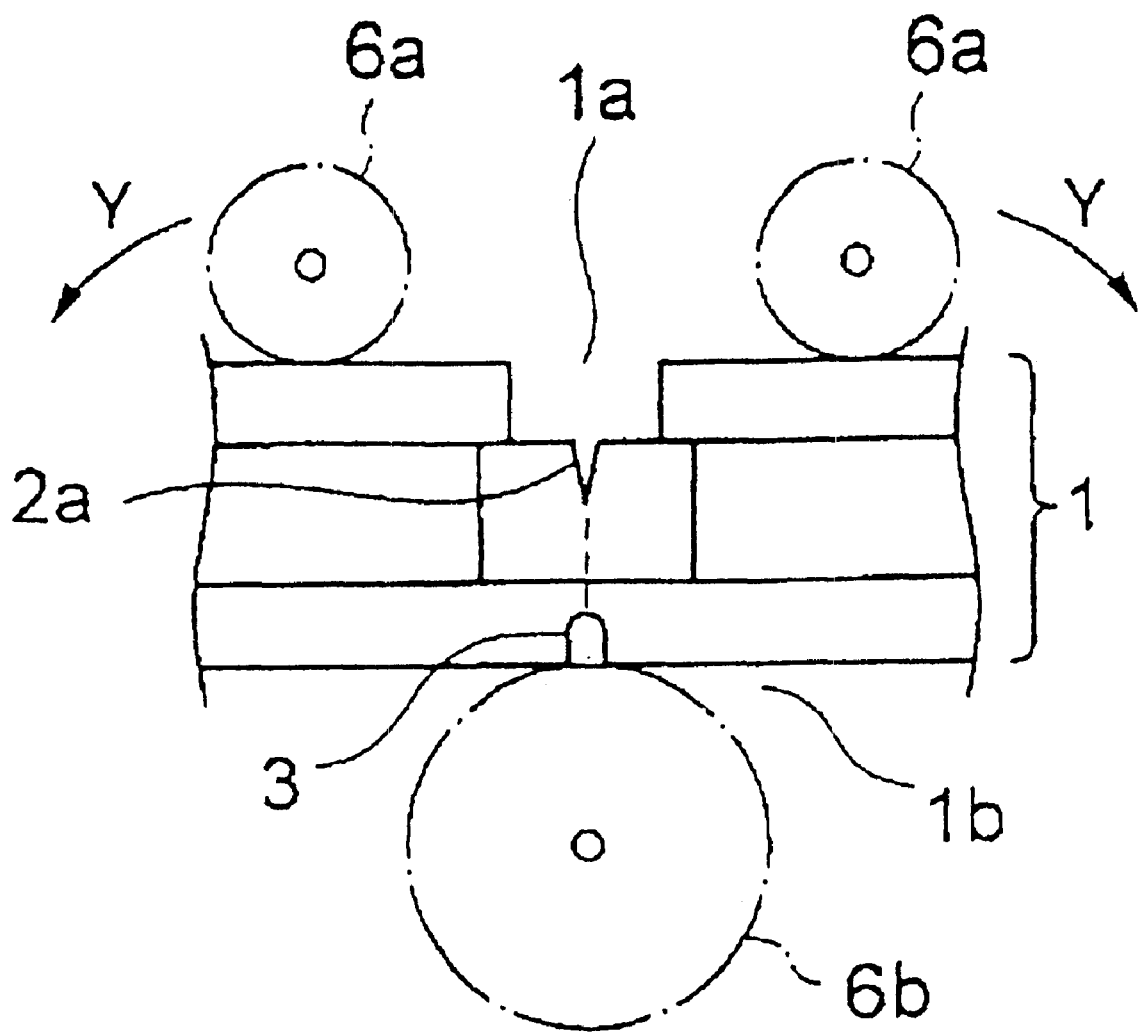
FIG. 5 is a section showing specific breaking equipment applicable to any one of the illustrative embodiments.

Briefly, the first to third embodiments each break the wafer for leadless chip carrier packages P on a package basis. A generally V-shaped groove 1a is formed in one major surface or front surface 1a of the wafer 1. The groove la extends in the direction of thickness of the wafer 1, i.e., the cut end P1 of the individual package P. A weak cleaving portion is formed in the other major surface or rear surface 1b of the wafer 1 and faces the groove 2a. As shown in FIG. 5, a cleaving force is applied to the wafer 1 so as to form a break in the cleaving portion. Subsequently, the wafer 1 is broken from the groove 2a toward the cleaving portion in the direction of thickness of the wafer 1.

FIG. 5 shows specific breaking equipment including a pair of rollers 6a and a roller 6b. When the wafer 1 is conveyed between the rollers 6a and the roller 6b, the rollers 6a and 6b exert a cleaving force on the wafer in a direction indicated by arrows Y. It is to be noted that the breaking equipment shown in FIG. 5 is not restrictive, but only illustrative.

Specifically, in the first embodiment shown in FIG. 2B, the cleaving portion is implemented by a groove 3 having a relatively great width that includes an alignment error with respect to the groove 2a. As shown in FIG. 5, when a cleaving force acts on the wafer 1, it tends to crush the groove 3. However, the groove or cleaving portion 3 is weak and broad enough to form the break 3a, so that the wafer 1 surely breaks along a line connecting the break 2a and the groove 2a.

In the second embodiment shown in FIG. 3, the cleaving portion is implemented by a plurality of grooves 4a and 4b that are substantially identical in shape with the groove 2a. The grooves 4a and 4b are positioned side by side in the form of the teeth of a saw. Again, as shown in FIG. 5, the cleaving force acting on the wafer 1 tends to crush the grooves 4a and 4b. However, the cleaving portion implemented by the grooves 4a and 4b is weak enough to form a cut 4c, allowing the wafer 1 to surely break along a line connecting the break 4c and the groove 2a.

Further, in the third embodiment shown in FIG. 4, the cleaving portion is implemented by a strip 5 different in the coefficient of thermal expansion from the wafer 1. When breaking equipment breaks the wafer 1 by it, a thermal stress acts at the interface between the wafer 1 and the strip 5 due to the above difference in the coefficient of thermal expansion. As a result, a break 5a is formed in the interface. The wafer 1 can therefore break along a line connecting the break 5a and the groove 2a.

As stated above, in the first to third embodiments, a cleaving force acts on the weak, cleaving portion of the wafer 1 that faces the groove 2a, thereby positively forming a break in the cleaving portion. The break is therefore surely positioned on the imaginary extension of the groove 2a in the direction of thickness of the wafer 1. This allows the wafer 1 to break in a preselected direction and frees the resulting chips from a burr.

If desired, the strip 5 shown in FIG. 4 may be implemented as a strong, non-cleaving portion. Specifically, as shown in FIG. 4, a strong, non-cleaving strip 7 may be positioned on the rear surface 1b of the wafer 1 in alignment with the groove 2a. In this case, the cleaving force acting on the wafer 1 as shown in FIG. 5 concentrates on the interface between the wafer 1 and the non-cleaving strip 7 and thereby forms a break 7a. Consequently, the wafer 1 surely breaks along a line connecting the break 7a and the groove 2a. In this alternative configuration, the non-cleaving portion is more rigid than the wafer 1. Such a non-cleaving portion may also be replaced with a material different in the coefficient of thermal expansion from the wafer 1, if desired.

As stated above, in the modification of the illustrative embodiment, when a cleaving force acts on the wafer 1, a cut is formed in the interface between the strong, non-cleaving portion and the wafer 1 due to a difference in cleaving force between the non-cleaving portion and the wafer 1. The wafer 1 therefore accurately breaks from the groove 2a toward the break 7a in a preselected direction along the cut end P1 of the package P.

In summary, it will be seen that the present invention provides a method of producing a semiconductor chip capable of breaking a wafer in a preselected direction from a V-shaped grooved formed in one major surface toward a break formed in the other major surface.

Various modifications will become possible for those skilled in the art after receiving the teachings of the present disclosure without departing from the scope thereof.

What is claimed is:

1. A method of producing a semiconductor device by breaking a multilayer wafer for leadless chip carrier packages on a packages basis, said method comprising the steps of:

forming a generally V-shaped groove in one of opposite major surfaces of the wafer in a direction of thickness of said wafer;

forming a weak, cleaving portion in the other major surface of the wafer in alignment with said groove; and exerting a cleaving force on the wafer to thereby form a break in said cleaving portion, thereby braking said wafer from said groove toward said cleaving portion in the direction of thickness of said wafer.

2. The method as claimed in claim 1, wherein said cleaving portion comprises a groove having a relatively great width including an alignment error with respect to said groove.

3. The method as claimed in claim 1, wherein said cleaving portion comprises a plurality of grooves positioned side by side in a form of teeth of a saw.

4. The method as claimed in claim 1, wherein said cleaving portion comprises a strip different in a coefficient of thermal expansion from the wafer.

5. A method of producing a semiconductor device by breaking a multilayer wafer for leadless chip carrier packages on a package basis, said method comprising the steps of:

forming a generally V-shaped groove in one of opposite major surfaces of the wafer in a direction of thickness of said wafer;

forming a strong, non-cleaving portion in the other major surface of the wafer in alignment with said groove; and exerting a cleaving force on the wafer to thereby form a break in an interface between said non-cleaving portion and said wafer due to a difference in cleaving force between said non-cleaving portion and said wafer, thereby breaking said wafer from said groove toward said non-cleaving portion in the direction of thickness of said wafer.

6. The method as claimed in claim 5, wherein said non-cleaving portion comprises a strip more rigid than the wafer.

* * * * *